US009429775B2

(12) United States Patent
Lee et al.

(10) Patent No.: US 9,429,775 B2
(45) Date of Patent: Aug. 30, 2016

(54) INFRARED TRANSMISSION LARGE-AREA SHUTTER

(71) Applicant: Samsung Electronics Co., Ltd., Suwon-si (KR)

(72) Inventors: Sang-hun Lee, Seoul (KR); Chang-young Park, Yongin-si (KR); Jong-oh Kwon, Suwon-si (KR); Yong-hwa Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 412 days.

(21) Appl. No.: 13/947,650

(22) Filed: Jul. 22, 2013

(65) Prior Publication Data

US 2014/0063583 A1 Mar. 6, 2014

(30) Foreign Application Priority Data

Sep. 6, 2012 (KR) .................. 10-2012-0098961

(51) Int. Cl.
*G02F 1/015* (2006.01)
*G02F 1/017* (2006.01)
*G02F 1/21* (2006.01)
*H01L 31/0224* (2006.01)
*H01L 31/0352* (2006.01)
*B82Y 20/00* (2011.01)

(52) U.S. Cl.
CPC .............. *G02F 1/015* (2013.01); *B82Y 20/00* (2013.01); *G02F 1/017* (2013.01); *G02F 1/01708* (2013.01); *G02F 1/218* (2013.01); *H01L 31/0224* (2013.01); *H01L 31/035236* (2013.01); *G02F 2001/213* (2013.01); *G02F 2203/11* (2013.01); *G02F 2203/12* (2013.01)

(58) Field of Classification Search
CPC .................. H01L 31/035236; H01L 31/0224; G02F 1/017; G02F 1/01708
USPC .................................................. 359/263, 245
See application file for complete search history.

(56) References Cited

U.S. PATENT DOCUMENTS 8,063,397 B2 * 11/2011 Mori ....................... H01L 33/30
257/18
8,094,361 B2 1/2012 Hampp et al.
2003/0063830 A1 * 4/2003 Jones ....................... G02B 6/12
385/2

(Continued)

FOREIGN PATENT DOCUMENTS

KR           100991044 B1   10/2010
KR      1020110081649 A    7/2011
KR      1020110108129 A   10/2011

*Primary Examiner* — Thomas K Pham
*Assistant Examiner* — Mitchell Oestreich
(74) *Attorney, Agent, or Firm* — Sughrue Mion, PLLC

(57) ABSTRACT

An infrared transmission large-area shutter is provided. The infrared transmission large-area shutter includes a first contact layer on a substrate, a plurality of stacks formed in a two-dimensional (2D) array pattern on a first region of the first contact layer, each stack comprising a lower reflection layer, an active layer, an upper reflection layer, and a second contact layer which are formed sequentially in this order on the first contact layer, a first electrode formed on the first contact layer, a plurality of second electrodes on the second contact layers, a first polymer layer that surrounds sidewalls of the plurality of stacks on the first contact layer, and a second polymer layer, which is transparent to infrared rays, to cover the second electrode on the second contact layer. A through hole corresponding to the plurality of stacks is formed in the substrate.

14 Claims, 7 Drawing Sheets

(56) References Cited

U.S. PATENT DOCUMENTS

| | | |
|---|---|---|
| 2004/0136680 A1 | 7/2004 | Medina et al. |
| 2007/0053628 A1* | 3/2007 | Park .................. G02F 1/0121 385/14 |
| 2009/0097098 A1 | 4/2009 | Piroux |
| 2009/0257113 A1* | 10/2009 | Smith ................. G02B 26/001 359/321 |
| 2010/0188725 A1 | 7/2010 | Goetz et al. |
| 2010/0232465 A1* | 9/2010 | Tsukiji ................. H01S 5/0425 372/45.01 |
| 2011/0181936 A1* | 7/2011 | Cho ....................... B82Y 20/00 359/260 |
| 2013/0270418 A1* | 10/2013 | Cho ....................... G02F 1/015 250/206.1 |

* cited by examiner

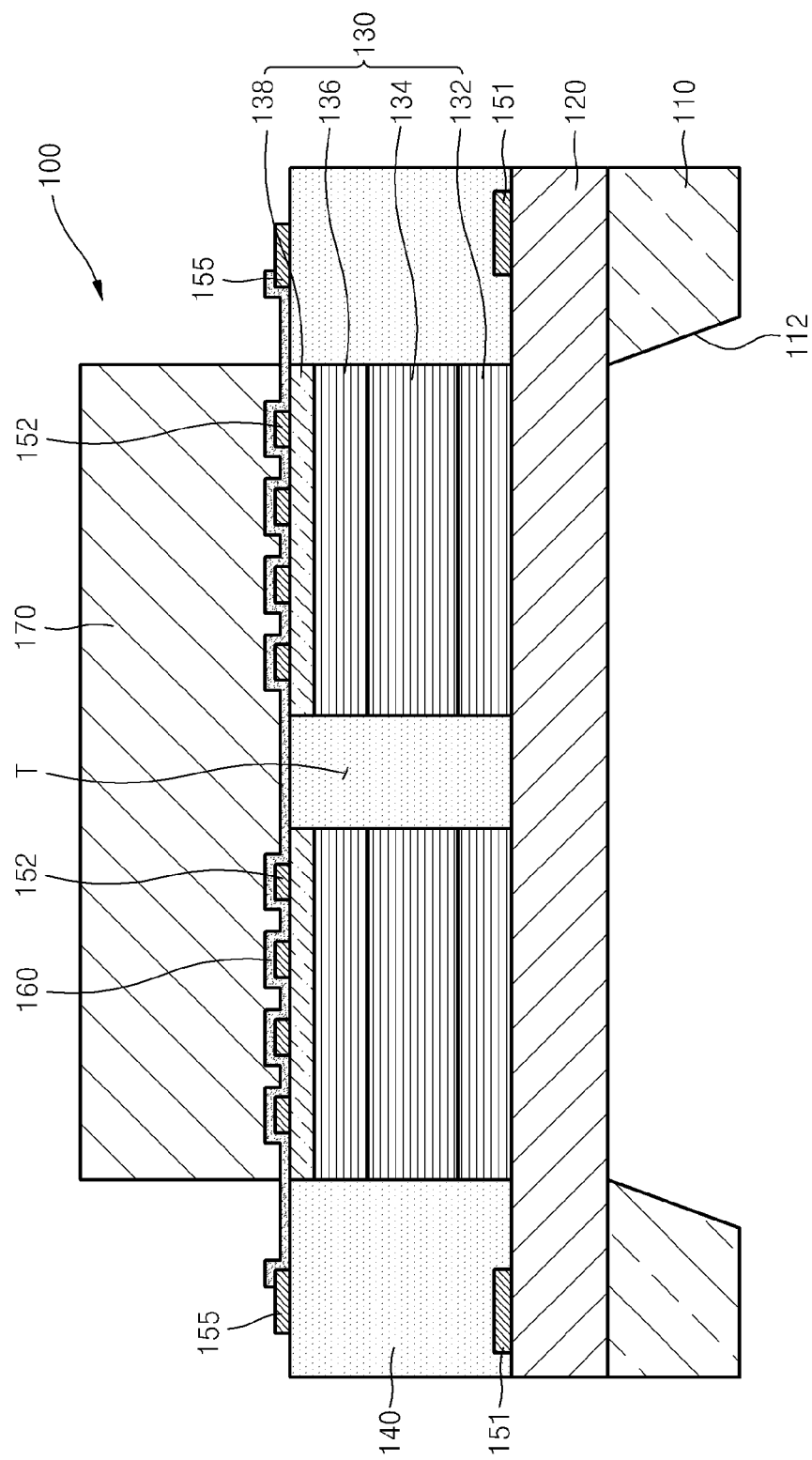

INFRARED TRANSMISSION LARGE-AREA SHUTTER

CROSS-REFERENCE TO RELATED APPLICATIONS

This application claims priority from Korean Patent Application No. 10-2012-0098961, filed on Sep. 6, 2012, in the Korean Intellectual Property Office, the disclosure of which is incorporated herein in its entirety by reference.

BACKGROUND

1. Field

Apparatuses and methods consistent with exemplary embodiments relate to an infrared transmission shutter, and more particularly, to an infrared transmission shutter formed on a large area and a method of manufacturing the same.

2. Description of the Related Art

To realize a three-dimensional (3D) image obtaining apparatus, such as a 3D camera, a means for measuring distances from multiple points on an object's surface is required. To obtain accurate distance information with respect to the object, a Time-of-Flight (TOF) method has been introduced. A phase delay measurement method, which is one of a number of TOF methods, uses external modulation to obtain a high-resolution distance image. To perform the external modulation, a GaAs semiconductor-based transmission optical shutter, which is easy to manufacture, has a compact size, and can be driven with a low voltage, has been recently proposed.

The GaAs semiconductor-based transmission shutter is disposed in front of a charge-coupled device (CCD) sensor to modulate light input to the sensor. The GaAs semiconductor-based transmission shutter has a simple structure and can be miniaturized, and thus, the GaAs semiconductor-based transmission shutter can be easily applied to a 3D camera.

The transmission shutter has multiple quantum wells (MQW) disposed between a p-type electrode and an n-type electrode and uses a phenomenon in which when a reverse bias voltage is applied to both the p-type and n-type electrodes, light is absorbed by the MQW. The GaAs semiconductor-based transmission shutter can be driven at a high speed, and its driving voltage is low, and a reflectivity difference between ON and OFF, that is, a contrast ratio, is high.

When the GaAs semiconductor-based transmission shutter is manufactured on a large area, because a GaAs substrate used as an epitaxial growth substrate is opaque with respect to infrared rays, removal of the GaAs substrate on a light transmission region is necessary, thereby making the optical shutter fragile.

SUMMARY

One or more exemplary embodiments provide an infrared transmission large-area shutter that has a reinforced resistance against mechanical deformation or shock.

Additional aspects will be set forth in part in the description which follows and, in part, will be apparent from the description, or may be learned by practice of the presented embodiments.

According to an aspect of an exemplary embodiment, an infrared transmission large-area shutter includes a first contact layer on a substrate, a plurality of stacks formed in a two-dimensional (2D) array pattern on a first region of the first contact layer, each stack including a lower reflection layer, an active layer, an upper reflection layer, and a second contact layer which are formed sequentially in this order on the first contact layer, a first electrode on the first contact layer, a plurality of second electrodes on each second contact layer, a first polymer layer that surrounds sidewalls of the stacks on the first contact layer in which the first polymer layer comprises a low dielectric constant, and a second polymer layer, which is transparent to infrared rays, to cover the second electrode on the second contact layer, in which a through hole corresponding to the plurality of stacks is formed in the substrate.

The infrared transmission large-area shutter may further include a plurality of second electrode pads that are connected to the plurality of second electrodes, in which the second electrode pads are disposed on the first polymer layer.

A trench may be formed between the plurality of stacks on the first region to expose the first contact layer, and the trench may be filled with the first polymer layer.

The first polymer layer may be formed of polyimide or a benzocyclobutene (BCB) polymer.

The first polymer layer may be formed to have substantially the same height as the stacks.

The second polymer layer may be formed of parylene or SU-8 photoresist.

The second polymer layer may have a thickness of 4 µm-1000 µm.

The first electrode may surround the plurality of stacks on the first contact layer and may be spaced apart from the plurality of stacks.

The first electrode may have an annular quadrangle shape, and at least two corners of the first electrode may be exposed by the plurality of stacks.

The infrared transmission large-area shutter may further include an insulating layer between the second contact layer and the second polymer layer to cover the second electrodes.

The first contact layer may transmit a near infrared ray (NIR) having a wavelength of 750 nm~3000 nm therethrough.

An optical thickness of the first contact layer may be an integer multiple of $\lambda$, which is a central wavelength of incident light.

The first contact layer may include $InGa_xAl_{1-x}P$ ($0 \leq x \leq 1$).

The lower reflection layer and the upper reflection layer may have optical thicknesses of $\lambda/4$ and the lower reflection layer and the upper reflection layer may have a structure in which a first refractive-index layer and a second refractive-index layer having different refractive indices are repetitively and alternately stacked.

The second electrodes may have a fish bone form.

One of the first and second electrodes may be an N-type electrode and the other may be a P-type electrode.

BRIEF DESCRIPTION OF THE DRAWINGS

These and/or other exemplary aspects and advantages will become apparent and more readily appreciated from the following description of the embodiments, taken in conjunction with the accompanying drawings in which:

FIGS. 3A through 3E are cross-sectional views showing a method of manufacturing an infrared transmission large-area shutter step-by-step, according to an exemplary embodiment.

DETAILED DESCRIPTION

Figure 1:
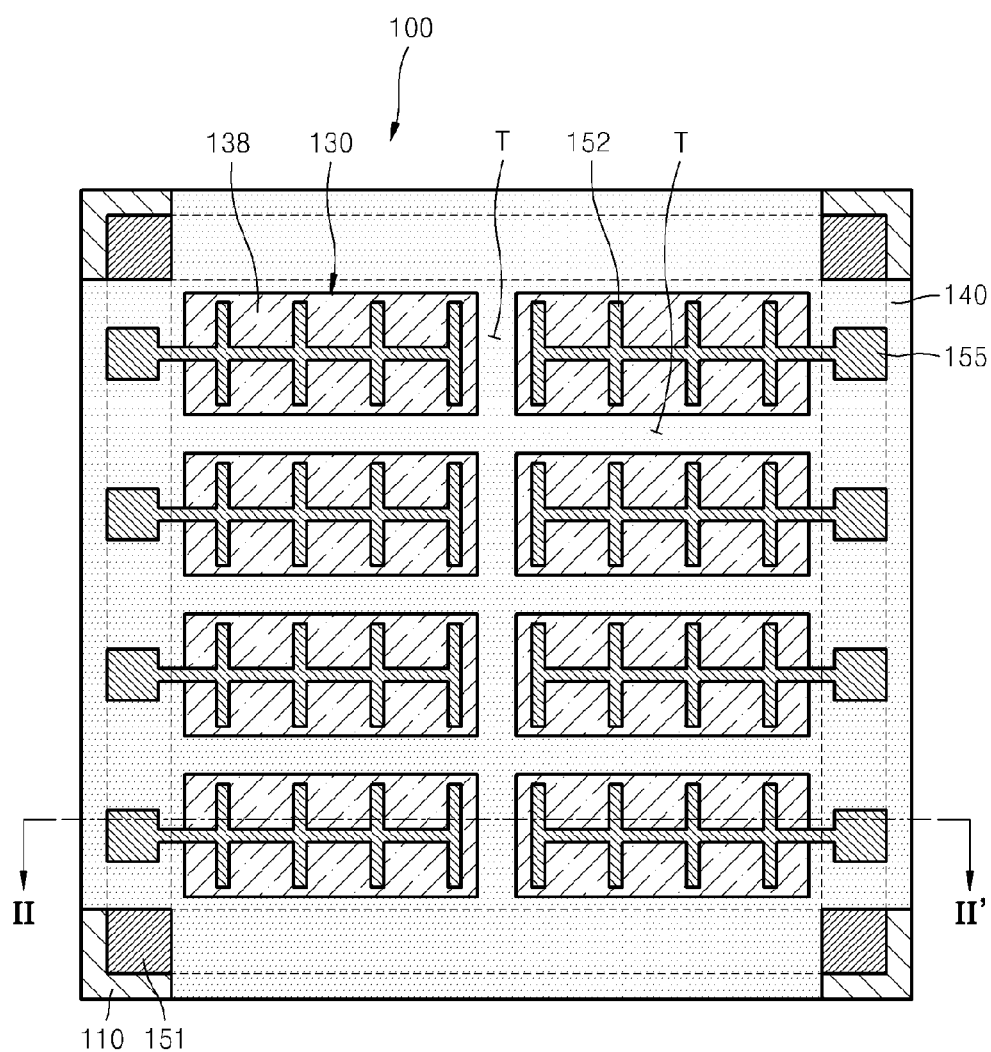
FIG. 1 is a plan view schematically showing a structure of an infrared transmission large-area shutter according to an exemplary embodiment.

Exemplary embodiments of the present disclosure will be described in detail with the accompanying drawings. In the description, the thicknesses of layers or regions shown in the drawings are shown exaggerated for clarity of the specification. In the specification, substantially identical components are referred to as identical reference numerals and will not be described in detail.

Figure 2:
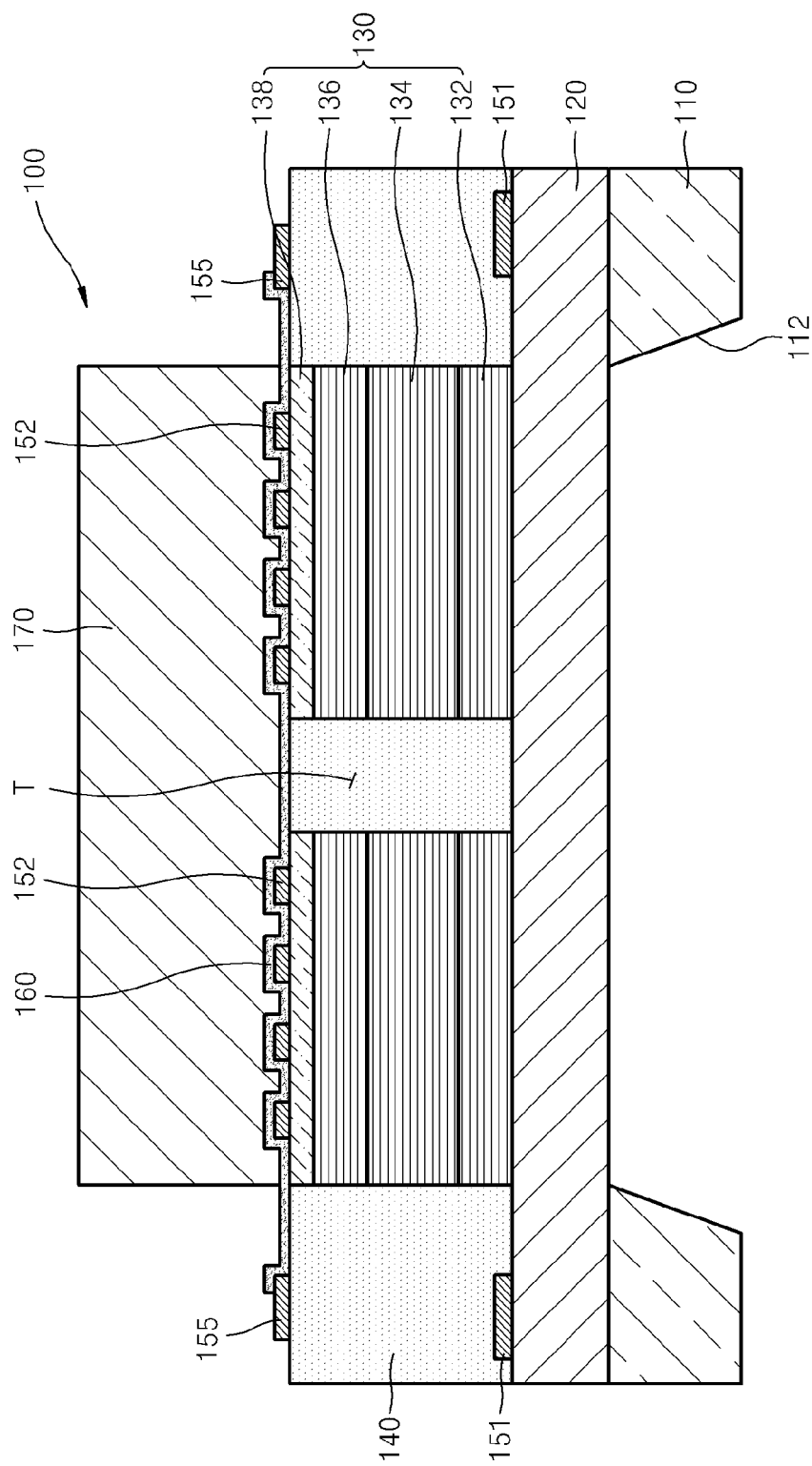
FIG. 2 is a cross-sectional view taken along line II-II' of FIG. 1.

FIG. 1 is a plan view schematically showing a structure of an infrared transmission large-area shutter 100 according to an exemplary embodiment. FIG. 2 is a cross-sectional view taken along line II-II' of FIG. 1. In FIG. 1, components on a second electrode are not shown for convenience sake.

Referring to FIGS. 1 and 2, the infrared transmission large-area shutter 100 may include a first contact layer 120 on a substrate 110, a plurality of stacks 130 on the first contact layer 120, a first polymer layer 140 surrounding sidewalls of each of the stacks 130, and a second polymer layer 170 covering each of the stacks 130 and a portion of the first polymer layer 140. A first electrode 151 is formed on the first contact layer 120. A second electrode 152 is formed on each of the stacks 130, and a second electrode pad 155 is formed on the first polymer layer 140 and is connected to the second electrode 152.

Each stack 130 may include a lower reflection layer 132, an active layer 134, an upper reflection layer 136, and a second contact layer 138 which are formed on the first contact layer 120 sequentially in this order.

The first contact layer 120 is doped with n-type or p-type impurities, and in the following description, for convenience sake, the first contact layer 120 is doped with n-type impurities. The first electrode 151 may be an n-type electrode, and the second electrode 152 may be a p-type electrode.

The first electrode 151 may be formed in the form of an annular quadrangle shape which encloses the plurality of stacks 130. The first electrode 151 is formed such that at least two regions thereof are exposed through the first polymer layer 140. Thus, even when electric connection is broken at a particular point, the first electrode 151 on another region may be connected to an external power source. In FIG. 1, four corners of the first electrode 151 are exposed through the first polymer layer 140.

The substrate 110 may be composed of, for example, undoped GaAs or the like. When the substrate 110 is composed of GaAs which is opaque with respect to infrared rays, a through hole 112 may be formed in the GaAs substrate 110 so that infrared rays transmit through the substrate 110. The through hole 112 may be formed in the substrate 110 by using the first contact layer 120 as an etch stop layer. The through hole 112 may be formed as a single hole which covers the entire area of the plurality of stacks 130.

The first contact layer 120 is connected to the first electrode 151 to supply a voltage to the active layer 134. Infrared rays, more specifically, a near infrared ray (NIR) having a wavelength of about 750 nm through about 3000 nm, may be transmitted through the first contact layer 120. For example, the infrared transmission large-area shutter 100 may be designed to have a central absorbing wavelength of about 850 nm. The first contact layer 120 may include InGaP, InAlP, InGa$_x$Al$_{1-x}$P (0<x<1), or the like. The first contact layer 120 may be an n-type contact layer doped with an n-type dopant, such as Si, S, Se, Te, etc.

An optical thickness (a product of a physical thickness and a refractive index of a layer material) of the first contact layer 120 may be an integer multiple of λ, which is a central wavelength of incident light. For example, the optical thickness of the first contact layer 120 may be about 1λ through about 20λ. Even if the thickness of the first contact layer 120 increases, a transmittance of infrared rays does not largely decrease and may be maintained in a specific range. Therefore, in place of the substrate 110 in which the through hole 112 is formed, the first contact layer 120 may support the infrared transmission large-area shutter 100, and the rigidity of the infrared transmission large-area shutter 100 may be improved.

The lower reflection layer 132 and the upper reflection layer 136 may each have a structure in which a low-refractive index layer and a high-refractive index layer are alternately and repetitively stacked. For example, the lower reflection layer 132 and the upper reflection layer 136 may respectively have a plurality of Al$_x$Ga$_{1-x}$As/Al$_y$Ga$_{1-y}$As structures including Al$_x$Ga$_{1-x}$As as a high-refractive index layer and Al$_y$Ga$_{1-y}$As as a low-refractive index layer (herein, 0<x<1, 0<y<1, and x<y). For example, the lower reflection layer 132 and the upper reflection layer 136 may have a structure in which Al$_{0.31}$Ga$_{0.69}$As/Al$_{0.84}$Ga$_{0.16}$As is repetitively stacked or Al$_{0.5}$Ga$_{0.5}$As/AlAs is repetitively stacked. The lower reflection layer 132 and the upper reflection layer 136 may be distributed Bragg reflector (DBR) layers, respectively.

When light having a particular wavelength is incident to the lower reflection layer 132 and the upper reflection layer 136, reflection occurs at an interface between two layers having different refractive indices (i.e., a high-refractive index layer and a low-refractive index layer) in the lower reflection layer 132 and the upper reflection layer 136. In this state, phase differences of all reflected light rays are made the same, thus obtaining high reflectivity. To this end, an optical thickness (i.e., a product of a physical thickness and a refractive index of a layer material) of each layer in the lower and upper reflection layers 132 and 136 may be an odd multiple of λ/4 (λ is a wavelength of incident light to be modulated). The reflectivity of the lower and upper reflection layers 132 and 136 may increase as the repetitive number of a pair including a high-refractive index layer and a low-refractive index layer increases. The lower and upper reflection layers 132 and 136 also serve as a path through which electric current flows to provide the current to the active layer 134. To this end, the lower reflection layer 132 may be a silicon-doped n-type DBR layer, and the upper reflection layer 136 may be a Beryllium (Be)-doped p-type DBR layer.

The active layer 134 may have a multiple quantum well (MQW) layer structure in which a quantum well layer and a barrier layer are repetitively stacked. For example, the active layer 134 may include a barrier layer composed of Al$_{0.31}$Ga$_{0.69}$As and a quantum well layer composed of GaAs. The active layer 134 serves as a cavity for Fabry-Perot resonance. To this end, when a central wavelength of incident light is λ, the active layer 134 may have an optical thickness of an integer multiple of λ/2. Then, light having a wavelength of λ may be sufficiently absorbed by the active layer 134 while resonating between the lower reflection layer 132 and the upper reflection layer 136. For example, the optical thickness of the active layer 134 may be 2λ. Generally, when the thickness of the active layer 134 is large, absorptivity increases and a driving voltage increases; when the thickness of the active layer 134 is small, absorptivity decreases and a driving voltage decreases.

The second contact layer 138 may be provided on the upper reflection layer 136. The second contact layer 138 may be connected to the second electrode 152 to supply a voltage to the active layer 134. The second contact layer 138 may include GaAs or the like. The GaAs material has a low surface oxidation rate and a small band gap, and thus it is useful for forming an ohmic contact electrode. The thickness of the second contact layer 138 may be about 100 Å considering an absorption loss of incident light. The second contact layer 138 may include InGaP, InAlP, $InGa_xAl_{1-x}P$ (0<x<1), or the like. The second contact layer 138 may be a p-type contact layer doped with a p-type dopant, such as Be, Zn, Mn, etc.

The first electrode 151 may be formed of a single metallic material, but may also have a multi-layer structure in which Pt/Ti/Pt/Au are stacked in this order. The first electrode 151 may be formed of a material, such as indium tin oxide (ITO), ZnO, aluminum zinc oxide (AZO), or the like, which has permeability with respect to light.

The second electrode 152 may be disposed on the second contact layer 138, and may be formed in a lattice pattern to reduce resistance. For example, in FIG. 1, the second electrode 152 is illustrated in a lattice pattern having a cross-sectional fish bone shape. However, the second electrode 152 may be formed having a cross-section in a lattice pattern having a mesh form as well as a fish bone form. In the lattice pattern, the overall area of the second electrode 152 decreases, and sheet resistance may decrease. When the second electrode 152 is formed of a metallic material, light incident to the infrared transmission large-area shutter 100 may be partially blocked. Thus, to minimize a loss of light, the width of each line of the second electrode 152 may be small, for example, about 10 µm-about 20 µm. The second electrode 152 may be formed of a single metallic material or may be formed in a multi-layer structure in which Pt/Ti/Pt/Au are stacked in this order. The second electrode 152 may be formed of a material, such as ITO, ZnO, AZO, or the like, which has permeability with respect to light.

When the first electrode 151 is grounded and a reverse bias voltage is applied to the second electrode 152, the active layer 134 absorbs light, such that an infrared light transmittance in the infrared transmission large-area shutter 100 decreases.

The first polymer layer 140 surrounding the stacks 130 is formed on outer sides of the stack 130. The first polymer layer 140 may be formed at the same height as the stack 130. The first polymer layer 140 may be formed of a material having a low dielectric constant, e.g., polyimide, benzocyclobutene (BCB), etc.

The first polymer layer 140 is also formed to fill a trench T, which is a region between the plurality of stacks 130, to insulate the stacks 130 from each other and fix the positions of the stacks 130.

The second electrode pad 155 may be disposed on the first polymer layer 140, and the second electrode pad 155 may be electrically connected to the corresponding second electrode 152.

Since the first polymer layer 140 has a dielectric constant of about 2.9, a capacitance between the second electrode pad 155 and the first electrode 151 is low. That is, when the second electrode pad 155 is disposed on a GaAs-based material, current applied to the stack 130 may leak because the dielectric constant of the GaAs-based material is high as about 13. On the other hand, the first polymer layer 140 composed of a low-dielectric constant material reduces the capacitance between the second electrode pad 155 and the first electrode 151. Thus, frequency-response characteristics of the infrared transmission large-area shutter 100 is improved.

An insulating layer 160 may be further formed on the first polymer layer 140 and the stack 130 to cover the second electrode 152. The insulating layer 160 may help adhesion between the second electrode 152 and the second polymer layer 170. The insulating layer 160 may be formed of silicon oxide or silicon nitride.

The second polymer layer 170 is formed of a material through which infrared rays are transmitted. The second polymer layer 170 may be formed of, for example, parylene or SU-8 photoresist. The second polymer layer 170 may be formed to have a thickness of about 4 µm-about 1000 µm.

When an infrared transmission shutter that has a large area is manufactured, a through hole is formed in most of the substrate 110, such that the plurality of stacks 130 may not be adequately supported and the total thickness of the stack 130 and the first contact layer 120 is as thin as about 5 µm and thus may easily break. To reinforce the device, the second polymer layer 170 is formed on the stack 130. When the thickness of the second polymer layer 170 is smaller than 4 µm, infrared incident light may be distorted. When the thickness of the second polymer layer 170 is larger than 1000 µm, a transmittance of infrared incident light may be reduced.

A shutter region of the infrared transmission large-area shutter 100 is divided into regions of the plurality of stacks 130, such that a total capacitance may be reduced. In addition, the first polymer layer 140 having a low dielectric constant is formed between the first electrode 151 and the second electrode pad 155, so that generation of a parasitic capacitance may be suppressed.

Since the second polymer layer 170, which is transparent to infrared rays, is formed on the stacks 130, the mechanical rigidity of the thin stack structure can be improved and the large-area shutter can be manufactured.

FIGS. 3A through 3E are cross-sectional views showing a method of manufacturing the infrared transmission large-area shutter 100 step-by-step, according to an embodiment of the present invention. Components which are substantially the same as components of the infrared transmission large-area shutter 100 shown in FIGS. 1 and 2 are referred to with identical reference numerals and are not described in detail.

Figure 3A:
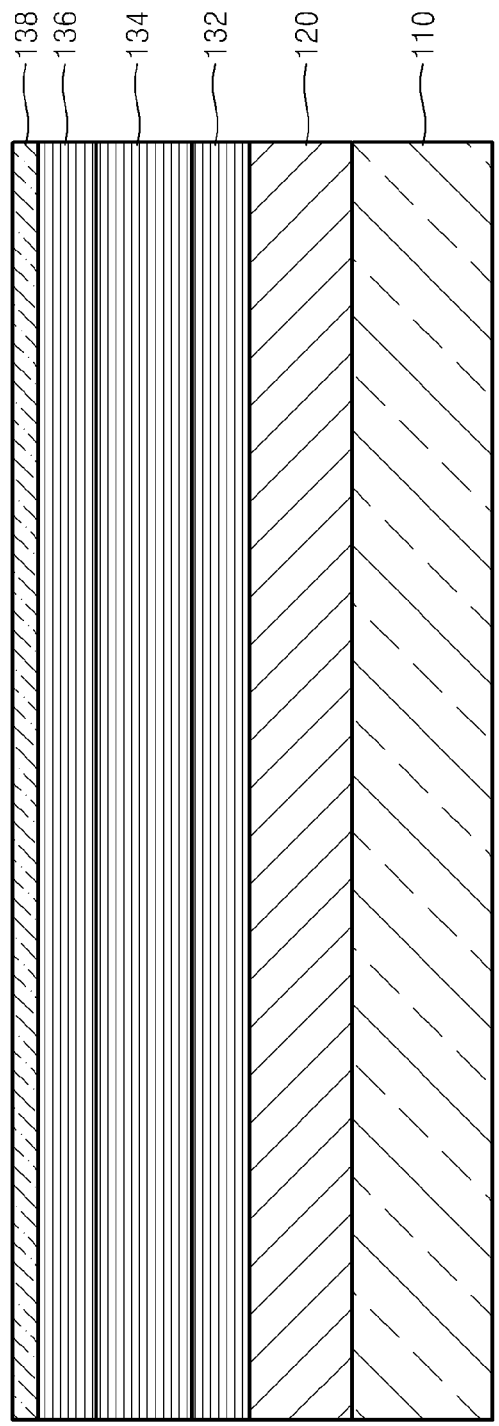

First, referring to FIG. 3A, the first contact layer 120, the lower reflection layer 132, the active layer 134, the upper reflection layer 136, and the second contact layer 138 are epitaxially grown in this order on the GaAs substrate 110.

The first contact layer 120, the lower reflection layer 132, the active layer 134, the upper reflection layer 136, and the second contact layer 138 may be formed using an epitaxial growth method. The first contact layer 120 may be, for example, an n-type contact layer doped with an n-type dopant, and the second contact layer 138 may be a p-type contact layer doped with a p-type dopant. The lower reflection layer 132 may be doped with an n-type dopant, and the upper reflection layer 136 may be doped with a p-type dopant.

Figure 3B:
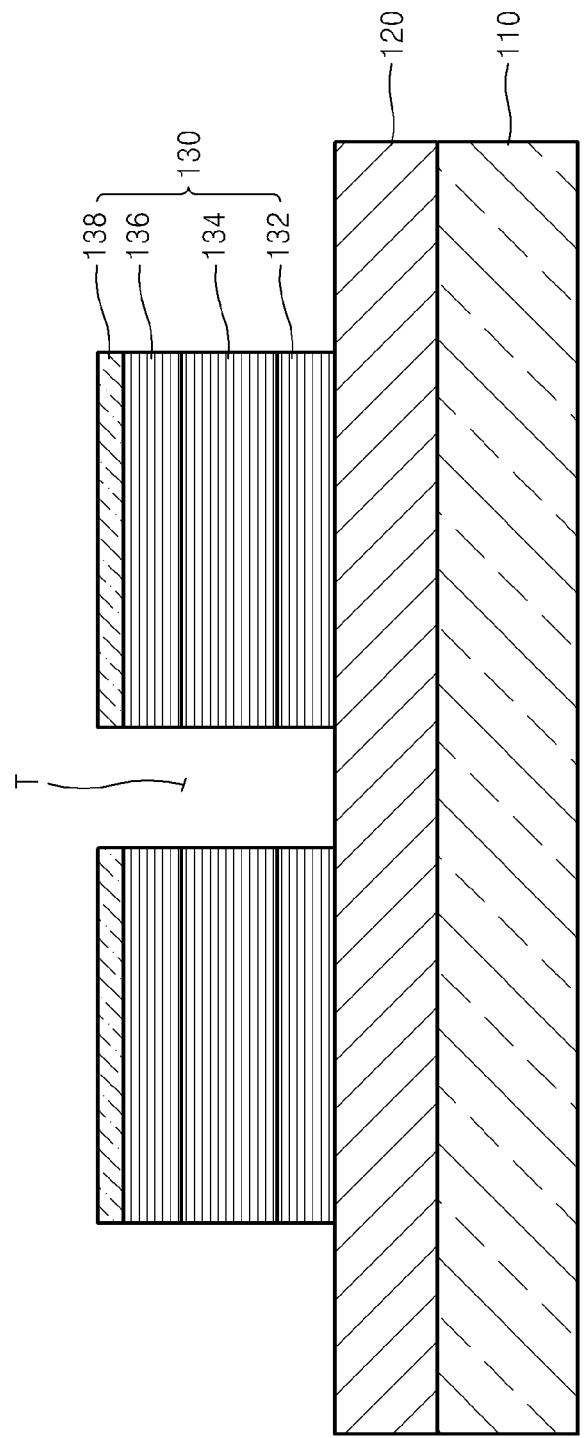

Referring to FIG. 3B, until the surface of the first contact layer 120 is exposed, the second contact layer 138, the upper reflection layer 136, the active layer 134, and the lower reflection layer 132 may be continuously etched using mesa etching. Thus, a plurality of stacks 130, including the second contact layer 138, the upper reflection layer 136, the active layer 134, and the lower reflection layer 132, may be formed spaced apart from one another on the first contact layer 120. The trench T is formed between the plurality of stacks 130. The plurality of stacks 130 may be arranged in a two-dimensional (2D) array pattern.

Figure 3C:
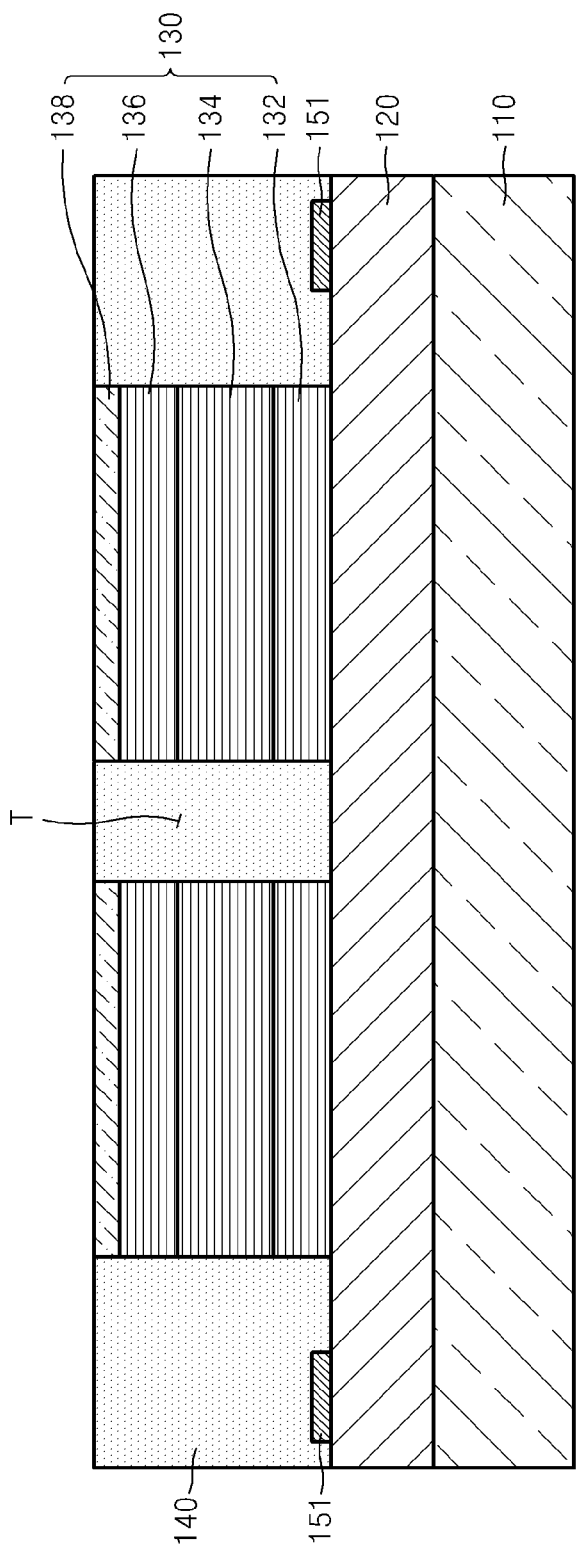

Referring to FIG. 3C, the first electrode 151 may be formed on the first contact layer 120. The first electrode 151 may be formed to surround the stacks 130 and to be spaced apart from the stacks 130. The first electrode 151 may be formed, for example, by a metal lift-off process. The first electrode 151 may be formed in the shape of an annular quadrangle form enclosing the stacks 130.

Next, the first polymer layer 140 is formed on the first contact layer 120 to cover the stacks 130 and the first electrode 151. The first polymer layer 140 may be formed by spin-coating a low-dielectric constant material, e.g., polyimide, BCB polymer, or the like. The first polymer layer 140 covering a top surface of the stacks 130 is selectively removed. The first polymer layer 140 is filled on sides of the stacks 130 and is filled also in the trench T. The first polymer layer 140 may be formed to have the same height as the stacks 130.

For external electric connection of the first electrode 151, a portion of the first electrode 151 is exposed in a process of spin-coating the first polymer layer 140 or a process of removing the first polymer layer 140 on the stacks 130. As shown in FIG. 1, the first electrode 151 may have the annular quadrangle shape and four corners thereof may be exposed.

Figure 3D:
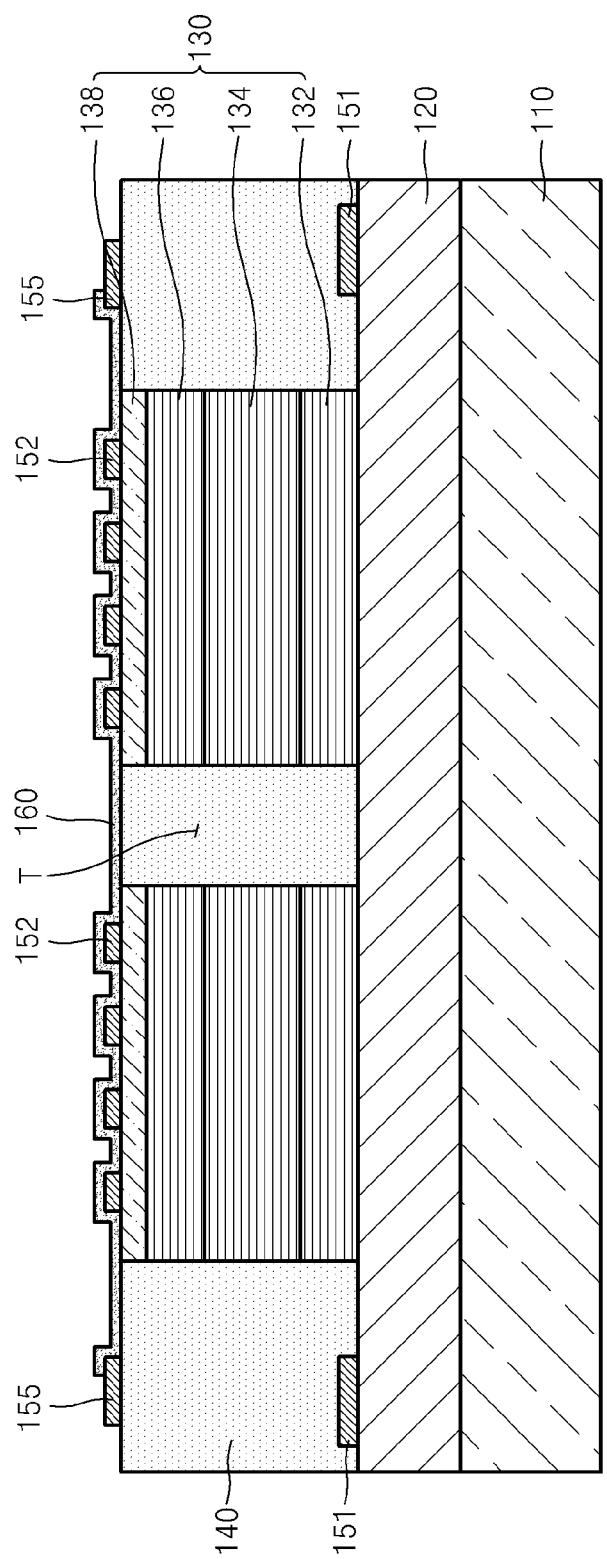

Referring to FIG. 3D, the second electrode 152 is formed on the second contact layer 138, and the second electrode pad 155 connected to the corresponding second electrode 152 may be formed on the first polymer layer 140. The second electrode 152 and the second electrode pad 155 may be formed by performing a lift-off process. The second electrode 152 may be formed in a fish bone form as shown in FIG. 1, to reduce a resistance area. In this case, a surface resistance may be reduced because the total area of the second electrode 152 is reduced.

The insulating layer 60 covering the second electrode 152 may be formed on the second contact layer 138. The insulating layer 160 may be formed to cover the plurality of stacks 130 and the trench T therebetween. The insulating layer 160 may be formed of silicon oxide or silicon nitride.

Referring to FIG. 3E, the second polymer layer 170 may be formed on the insulating layer 160 to cover an area of the plurality of stacks 130. The second polymer layer 170 may be formed of, for example, parylene or SU-8 photoresist. The second polymer layer 170 may be formed to have a thickness of about 4 μm through 1000 μm.

Next, the through hole 112 is formed in the substrate 110. For example, backside etching may be performed on the bottom of the substrate 110, thus forming the through hole 112. In this state, the first contact layer 120 may be used as an etch stop layer. Thus, a method of manufacturing the infrared transmission large-area shutter may remove a portion of the GaAs substrate 110 having a low transmittance with respect to infrared rays, without damaging other layers. One through hole 112 may be formed under the plurality of stacks 130 provided on the substrate 110.

As described above, according to an exemplary embodiment, a shutter region of an infrared transmission large-area shutter may be divided into a plurality of stack regions, such that a total capacitance may be reduced. In addition, a first polymer layer having a low dielectric constant is formed between a first electrode and a second electrode pad, such that generation of a parasitic capacitance may be suppressed.

Since a second polymer layer, which is transparent to infrared rays, is formed on the stacks, the mechanical rigidity of the thin stack structure can be improved and a large-area shutter can be manufactured.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. An infrared transmission large-area shutter comprising:
   a first contact layer disposed on a substrate;
   a plurality of stacks formed in a two-dimensional array pattern on a first region of the first contact layer, each stack comprising a lower reflection layer formed on the first contact layer, an active layer disposed on the lower reflection layer, an upper reflection layer formed on the active layer, and a second contact layer formed on the upper reflection layer;
   a first electrode formed on the first contact layer;
   a plurality of second electrodes, each of the plurality of second electrodes formed on respective one of the plurality of stacks;
   a first polymer layer that surrounds sidewalls of each of the plurality of stacks; and
   a second polymer layer, which is transparent to infrared rays and which covers the plurality of second electrodes on the second contact layer,
   wherein the substrate comprises a through hole formed through the substrate in a location corresponding to a location of the plurality of stacks,
   a trench is formed in the first region between each neighboring pair of stacks of the plurality of stacks to define each of the plurality of stacks, and the trench exposes the first contact layer and is completely filled with the first polymer layer, and
   the first electrode surrounds the plurality of stacks and is spaced apart from each of the plurality of stacks and from the trench in the first region.

2. The infrared transmission large-area shutter of claim 1, further comprising a plurality of second electrode pads, wherein each of the plurality of second electrode pads is connected to one of the plurality of second electrodes,
   wherein the plurality of second electrode pads are disposed on the first polymer layer.

3. The infrared transmission large-area shutter of claim 1, wherein the first polymer layer comprises polyimide or a benzocyclobutene polymer.

4. The infrared transmission large-area shutter of claim 1, wherein a height of the first polymer layer is substantially equal to a height of each of the plurality of stacks.

5. The infrared transmission large-area shutter of claim 1, wherein the second polymer layer comprises parylene or an SU-8 photoresist.

6. The infrared transmission large-area shutter of claim 1, wherein the second polymer layer has a thickness of 4 μm-1000 μm.

7. The infrared transmission large-area shutter of claim 1, wherein the first electrode has a cross-sectional annular quadrangle shape, and at least two corners of the first electrode are exposed by the plurality of stacks.

8. The infrared transmission large-area shutter of claim 1, further comprising an insulating layer between the second contact layer and the second polymer layer, wherein the insulating layer covers the plurality of second electrodes.

9. The infrared transmission large-area shutter of claim 1, wherein the first contact layer transmits near infrared rays having a wavelength of 750 nm~3000 nm therethrough.

10. The infrared transmission large-area shutter of claim 1, wherein an optical thickness of the first contact layer is an integer multiple of $\lambda$, wherein $\lambda$ is a central wavelength of incident light.

11. The infrared transmission large-area shutter of claim 1, wherein the first contact layer comprises $InGa_xAl_{1-x}P$ ($0 \le x \le 1$).

12. The infrared transmission large-area shutter of claim 1, wherein the lower reflection layer and the upper reflection layer each have optical thicknesses of $\lambda/4$ and the lower reflection layer and the upper reflection layer each have a structure in which a first refractive-index layer having a first refractive index and a second refractive-index layer having a second refractive index, different from the first refractive index are repetitively and alternately stacked, wherein $\lambda$ is a central wavelength of incident light.

13. The infrared transmission large-area shutter of claim 1, wherein each of the plurality of second electrodes has a cross-sectional area shaped in a fish bone form.

14. The infrared transmission large-area shutter of claim 1, wherein one of the first electrode and the plurality of second electrodes is an N-type electrode and the other is a P-type electrode.

* * * * *